United States Patent [19]

Hagen et al.

[11] Patent Number: 6,010,825
[45] Date of Patent: Jan. 4, 2000

[54] NEGATIVELY ACTING PHOTORESIST COMPOSITION BASED ON POLYIMIDE PRECURSORS

[75] Inventors: Sigurd Hagen, Binzen; Nadia Reichlin, Riehen, both of Germany

[73] Assignee: Olin Microelectronics Chemicals, Inc., Norwalk, Conn.

[21] Appl. No.: 09/151,218

[22] Filed: Sep. 10, 1998

[51] Int. Cl.[7] ............................. G03F 7/038; G03F 7/30
[52] U.S. Cl. ................. 430/283.1; 430/311; 430/325; 522/141; 522/142; 522/146; 522/164
[58] Field of Search ................. 430/283.1, 311, 430/325; 522/141, 142, 146, 164

[56] References Cited

U.S. PATENT DOCUMENTS

| | | |
|---|---|---|
| 3,552,973 | 1/1971 | Fishman . |
| 3,957,512 | 5/1976 | Kleeberg et al. . |
| 4,040,831 | 8/1977 | Rubner et al. . |
| 4,278,751 | 7/1981 | Specht et al. . |
| 4,366,228 | 12/1982 | Specht et al. . |
| 4,515,887 | 5/1985 | Davis . |
| 4,548,891 | 10/1985 | Riediker et al. . |
| 4,579,809 | 4/1986 | Irving ..................... 430/283 |
| 4,670,535 | 6/1987 | Sugio et al. ............. 528/220 |
| 5,019,482 | 5/1991 | Ai et al. . |
| 5,106,720 | 4/1992 | Mueller et al. ......... 430/285 |
| 5,342,739 | 8/1994 | Katou et al. . |
| 5,446,074 | 8/1995 | Czornyji et al. ....... 522/164 |
| 5,449,705 | 9/1995 | Watanabe ............... 522/148 |
| 5,756,260 | 5/1998 | Sashida et al. ........ 430/283.1 |
| 5,856,065 | 1/1999 | Hagen ................... 430/283.1 |
| 5,866,627 | 2/1999 | Czornyj et al. ......... 522/18 |

FOREIGN PATENT DOCUMENTS

| | | |
|---|---|---|
| 0 421195 | 4/1991 | European Pat. Off. . |
| 478 321 | 11/1997 | European Pat. Off. . |

*Primary Examiner*—Cynthia Hamilton
*Assistant Examiner*—Barbara Gilmore
*Attorney, Agent, or Firm*—Ohlandt, Greeley, Ruggiero & Perle

[57] ABSTRACT

A negatively operating photoresist composition comprising:

(a) a polyimide precursor containing repeating structural units of formula (1)

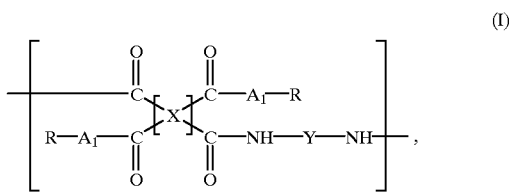

the composition comprises in all as many structural units of formula (I), which have residues $R_2$, that the composition can be developed by means of aqueous-alkaline developers for photoresists, which are free of organic solvents.

15 Claims, No Drawings

NEGATIVELY ACTING PHOTORESIST COMPOSITION BASED ON POLYIMIDE PRECURSORS

FIELD OF THE INVENTION

The present application concerns a negatively operating photoresist composition containing:

(a) a polyimide precursor containing repeating structural units of the formula (I)

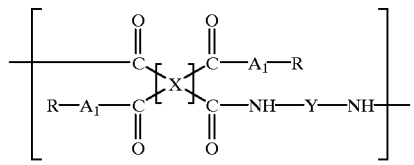

(I)

in which A1 stands for an oxygen atom or an NH group,
R stands for the same or different organic residues, at least one part of which is photopolymerizable,
[X] indicates the residue of a cyclic dianhydride of the same or different tetracarboxylic acids remaining after removal of the anhydride groups, and
Y indicates the residue of the same or different diamines remaining after removal of the amino groups, and (b) a photoinitiator for polymerizing olefinic double bonds.

BACKGROUND OF THE INVENTION

Photoresists of the initially named type have already been known for a long time and are described, for example, in U.S. Pat. Nos. 30,957,512, 4,040,831, 4,548,891 or EP-A-0 624,826 (U.S. patent application Ser. No. 08/524,648). In the named photoresist compositions, the residue R represents all organic residues with a photopolymerizable olefinic double bond, so that the compositions are cross-linked by the action of radiation of suitable wavelength via the photopolymerizable olefinic double bonds in the photoreactive polyimide precursor. The named negative resists have a very high sensitivity and show only very small dark removal [stripping] in development. Further, they have the advantage that a coating produced with their help can be converted into a polyimide coating by curing after exposure and development, whereby the coating is particularly heat-resistant. However, it is a disadvantage that such negative resists up to now have had to be treated with developers that are practically completely comprised of organic solvents, which, of course, is undesirable, due to the expenditure associated therewith for environmentally friendly disposal, and due to their inflammability.

In ACS Polym. Prep. Vol. 33 (1), April 1992, Rumiko Hayase et al. describe positively operating photoresist compositions comprised of 80 weight percent of a polyimide precursor of the above formula (I), in which R represents a 2-hydroxybenzyl residue, and 20 weight percent of a naphthoquinone diazide compound, as is usually used as a radiation-sensitive solution inhibitor for conventional positive photoresists. For the development of the named positive resists, developers can be used, in fact, which are comprised predominantly of common aqueous-alkaline developer solutions for photoresists, e.g., an aqueous tetramethylammonium hydroxide solution, but these solutions must still contain a considerable portion of methanol (approximately 12 volumetric percent), so that a sufficiently high rate of dissolution of the resist material in the developer is assured. In addition, the named positive photoresists show a relatively high dark stripping and lead to problems with process stability.

The object of the present invention is to make available a negatively operating photoresist composition based on polyimide precursors of the above-named formula (I), which permit the use under common practice conditions of conventional, e.g., commercially available, aqueous-alkaline developers, which are free of organic solvents.

BRIEF SUMMARY OF THE INVENTION

According to the invention, this object is resolved in that a negatively operating photoresist composition containing (a) a polyimide precursor containing repeating structural units of formula (I)

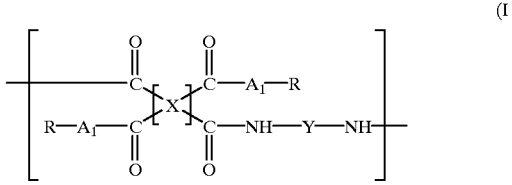

(I)

(a) a polyimide precursor containing repeating structural units of formula (I) in which A1 stands for an oxygen atom or an NH group,
R stands for the same or different organic residues, at least one part of which is photopolymerizable,
[X] indicates the residue of the cyclic dianhydride of the same or different tetracarboxylic acids remaining after removal of the anhydride groups, and
Y indicates the residue of the same or different diamines remaining after removal of the amino groups, as well as (b) a photoinitiator for the polymerizing of olefinic double bonds is made available, which is characterized in that
R stands for organic residues selected from
$R_1$ organic residues with a photopolymerizable olefinic double bond, and
$R_2$ aryl residues, which each have one or more substituents, which improve the solubility of the photoresist composition in aqueous-alkaline media, and the composition contains overall as many structural units of formula (I) which have residues R2, so that the composition can be developed by means of aqueous-alkaline developers for photoresists, which are free of organic solvents.

DETAILED DESCRIPTION OF THE PREFERRED EMBODIMENT

Group [X] may represent in the photoreactive polyimide precursor of formula (I) suitable for the present invention, e.g., the residue of one member or different members of the following dianhydrides remaining after removal of the anhydride groups: pyromellitic acid dianhydride (=PMDA), 3,3', 4,4'-biphenyltetracarboxylic acid dianhydride, 3,3',4,4'-diphenyl sulfide tetracarboxylic acid dianhydride, 3,3',4,4'-diphenyl sulfone tetracarboxylic acid dianhydride, 3,3',4,4'-benzophenone tetracarboxylic acid dianhydride, 3,3',4,4'-diphenylmethane tetracarboxylic acid dianhydride, 2,2',3,3'-diphenylmethane tetracarboxylic acid dianhydride, 2,3,3',4'-biphenyl tetracarboxylic acid dianhydride, 2,3,3',4'- benzophenone tetracarboxylic acid dianhydride, dianhydrides of oxydiphthalic acids, particularly 3,3',4,4'-diphenyloxide tetracarboxylic acid dianhydride, (4,4'-oxydiphthalic acid dianhydride), 2,3,6,7-naphthalene tetracarboxylic acid dianhydride, 1,4,5,7-naphthalene tetracarboxylic acid dianhydride, 2,2-bis(3,4-dicarboxyphenyl) propane dianhydride, 2,2-bis(2,3, dicarboxyphenyl)propane dianhydride, 2,2-bis(3,4-dicarboxyphenyl) hexafluoropropane dianhydride, 1,3-diphenyl-hexafluoropropane-3,3,4,4-tetracarboxylic acid dianhydride, 1,4,5,6-naphthalene tetracarboxylic acid dianhydride, 2,2',3, 3'-diphenyltetracarboxylic acid dianhydride, 3,4,9,10-perylene tetracarboxylic acid dianhydride, 1,2,4,5-naphthalene tetracarboxylic acid dianhydride, 1,4,5,8-naphthalene tetracarboxylic acid dianhydride, 1,8,9,10-phenanthrene tetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzenetetracarboxylic acid dianhydride, or represent their $C_1$–$C_6$ alkyl and $C_1$–$C_6$ alkoxy derivatives. These compounds are known and in part are obtainable commercially. Mixtures of dianhydrides, such as those named, may also be used.

Group Y can represent the residue of the same or different aliphatic, cycloaliphatic or aromatic diamines remaining after the removal of the amino groups, e.g., the following: 1,2-diaminoethane, 1,2-diaminopropane, 1,3-diaminopropane, 1,4-diaminobutane and 1,6-diaminohexane; 1,2- or 1,3-diaminocyclopentane, 1,2-, 1,3- or 1,4-diaminocyclohexane, 1,2-, 1,3- or 1,4-bis (aminomethyl)cyclohexane, bis-(4-aminocyclohexyl) methane, bis-(3-aminocyclohexyl)methane, 4,4'-diamino-3, 3'-dimethylcyclohexylmethane and isophorone diamine; m- and p-phenylenediamine, diaminotoluene, 4,4'-and 3,3'-diaminobiphenyl, 4,4'- and 3,3'-diaminodiphenyl ether, 4,4'- and 3,3'-diarninodiphenylmethane, 4,4'- and 3,3'-diarninodiphenylsulfone, 4,4'- and 3,3'-diaminodiphenyl sulfide, 4,4'- and 3,3'-diaminobenzophenone, 3,3'-dimethyl4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl) hexafluoropropane, 2,2-bis(3-hydroxy-4-aminophenyl) propane, 2,2-bis(3-hydroxy-4-aminophenyl) hexafluoropropane, 4,4'-diaminoparaterphenyl, 4,4'-bis(4-aminophenoxy)biphenyl, bis[4-(4-aminophenoxy)phenyl] sulfone, bis[4-(3-aminophenoxy)phenyl]sulfone, bis[4-(2-aminophenoxy)phenyl]sulfone, 1,4-bis(4-aminophenoxy) benzene, 9,10-bis(4-aminophenyl)anthracene, 3,3'-dimethyl-4,4'-diaminodiphenylsulfone, 1,3-bis(4-aminophenoxy)benzene, 1,3-bis(3-aminophenoxy)benzene, 1,3-bis(4-aminophenyl)benzene, bis[4-(4-aminophenoxy) phenyl ether, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy) phenyl]propane, 2,2- bis[4-(4-aminophenoxy)phenyl] hexafluoropropane, 2,2- bis(4-aminophenyl) hexafluoropropane, 9,9-bis(4-aminophenyl)-10-hydroanthracene, 3,3', 4,4'-tetraaminobiphenyl, 3,3',4,4'-tetraaminodiphenyl ether, 1,4-diaminoanthraquinone, 1,5-diaminoanthraquinone, bis[4-(4-aminophenoxy)phenyl] sulfone, bis[4-(3-aminophenoxy)phenyl]sulfone, bis[4-(2-aminophenoxy)phenyl]sulfone, 3,3-dihydroxy-4,4'-diaminobiphenyl, 9,9'-bis(4-aminophenyl)fluorene, 4,4'-dimethyl-3,3'-diaminodiphenylsulfone, 3,3',5,5'-tetramethyl-4,4'-diaminodiphenylmethane, 2,4- and 2,5-diaminocumene, 2,5-dimethyl-p-phenylenediamine, acetoguanamine, 2,3,5,6-tetramethyl-p-phenylenediamine, 2,4,6-trimethyl-m-phenylenediamine, bis(3-aminopropyl) tetramethyldisiloxane, 2,7-diaminofluorene, 2,5-diaminopyridine, 1,2-bis(4-aminophenyl)ethane, diaminobenzanilide, esters of diaminobenzoic acid, 1,5-diaminonaphthalene, diaminobenzotrifluoride, diaminoanthraquinone, 1,3-bis(4-aminophenyl) hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2- bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl) phenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2-bis[4-(4-amino-3-trifluoromethylphenoxy)phenyl]hexafluoropropane, 3,3',5,5'-tetramethyl-4,4'-diaminobiphenyl, 3,3'-dimethoxy-4,4'-diaminobiphenyl, 2,2',5,5',6,6'-hexfluorotolidene and 4,4'''-diaminoquaterphenyl.

In addition to the repeating structural units of formula (I), all of which are based on a type of group [X] or group Y, the polyimide precursors of the compositions according to the invention may also contain structural units of formula (I), which are based on two or more different types of these groups. In addition, the polyimide precursors also contain structural units of formula (I), which are structural isomers of one another. How structural isomer pairs of units of formula (I) appear is presented below on the example of units of formula (I), which are derived from pyromellitic acid as group [X] ($A_1$=—O—):

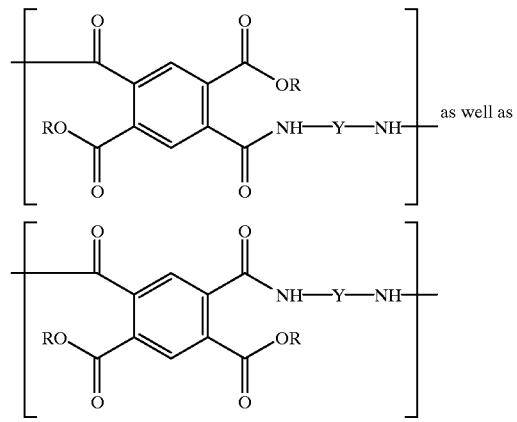

as well as $A_1$ preferably represents an oxygen atom in formula (I).

In formula (I), R1 indicates, e.g., vinyl, allyl, methallyl or a residue of formula (III)

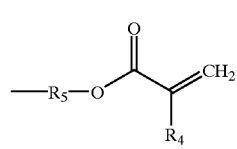

(III)

in which $R_4$ indicates hydrogen or methyl and $R_5$ stands for —$C_nH_{2n}$— with n=2–12, —$CH_2CH(OH)$ $CH_2$— or polyoxyalkylene with 4–30 C atoms.

Examples of suitable residues $R_5$ are ethylene, propylene, trimethylene, tetramethylene, 1,2-butanediyl, 1,3-butanediyl, pentamethylene, hexamethylene, octamethylene, dodecamethylene, —CH$_2$CH(OH)CH$_2$—, —(CH$_2$CH$_2$O)$_m$—CH$_2$CH$_2$—,

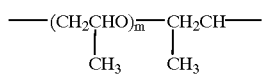

—(CH$_2$CH$_2$CH$_2$O)$_m$—CH$_2$CH$_2$CH$_2$— and —(CH$_2$CH$_2$CH$_2$CH$_2$O)$_m$—CH$_2$CH$_2$CH$_2$CH$_2$— with m=1–6. $R_5$ is preferably ethylene, propylene, trimethylene or —CH$_2$CH(OH)CH$_2$—, and R4 is preferably methyl.

Particularly preferred, $R_1$ is a residue of formula (III), in which $R_4$ indicates methyl and $R_5$ stands for ethylene.

Groups $R_2$ are preferably selected from aryl and aralkyl residues, particularly from $C_6$–$C_{20}$ aryl and $C_7$–$C_{25}$ aralkyl residues, very particularly from phenyl and benzyl residues, each of which have one, two or three, preferably one acidic residue joined to the aryl carbon atom as the substituent improving the solubility of the photoresist composition in aqueous-alkaline media. Particularly preferred, this residue involves HO groups.

Negatively operating photoresist compositions according to the present invention, in which $R_2$ is selected from 2-hydroxybenzyl, 3-hydroxybenzyl and 4-hydroxybenzyl, among others, have proven to be particularly good.

In the photoresist compositions according to the invention, the molar ratio between groups $R_1$ and groups $R_2$ in the composition preferably amounts to 4:1 to 1:4, particularly 1:1 to 1:2.

The compositions, for example, may be based on polyimide precursors that contain both residues of type $R_1$ and $R_2$.

Another form of embodiment is formed, e.g., by compositions, which contain as component (a) a composition of polyimide precursors, comprised of (a1) at least one polyimide precursor, which contains repeating structural units of formula (I), in which R represents an organic residue $R_1$ with a photopolymerizable olefinic double bond, as well as (a2) at least one other polyimide precursor, which contains repeating structural units of formula (I), in which R represents an aryl residue $R_2$, which has one or more substituents, which improve the solubility of the photoresist composition in aqueous-alkaline media. In addition to the above-described repeating units of formula (I), the polyimide precursors of the compositions according to the invention may also contain repeating structural units of another type, as long as the fraction of units of formula (I) in the polymer is sufficiently high in order to assure that after the development of the exposed regions of the resist, at least 50% of the original thickness of the resist coating is present (50% layer thickness retention in development).

The weight average molecular weight ($M_w$) of the photoreactive polyimide precursors preferably amounts to 1,000 to 100,000, particularly 3,000 to 50,000 and most particularly preferred 5,000 to 30,000. The average molecular weight ($M_w$) of a specific photoreactive polyimide precursor may be determined, e.g., by means of gel permeation chromatography with polystyrene calibration.

Photoreactive polyimide precursors may be produced analogously to known procedures, for example, analogously to the methods that are described in ACS Polym. Prep., Vol. 33(1), April 1992, or reference is made to those in EP-A-0 624,826. A way of preparing the polyimide precursors can also be seen from the examples.

As photoinitiator component (b), in principle, all photoinitiators known to the person skilled in the art may be utilized, which have a sufficiently high sensitivity in the region of wavelengths, for which the resist composition will be sensitive. Examples of such photoinitiators are, e.g., indicated by K. K. Dietliker in "Chemistry and Technology of UV and EB formulation for Coatings, Inks and Paints", Volume 3: "Photoinitiators for Free Radical and Cationic Polymerization". For example, benzoin ethers are suitable, such as, e.g., benzoin methyl ether, ketals, such as diethoxyacetophenone or benzildimethyl ketal, hexaarylbisimidazole, quinones, such as, e.g., 2-tert-butylanthraquinone, or thioxanthones, which are preferably utilized in combination with amine coinitiators, such as, for example, thioxanthone, 2-isopropylthioxanthone or 2-chlorothioxanthone, azides and acylphosphine oxides, such as, e.g., 2,4,6-trimethylbenzoyldiphenyl phosphine oxide.

Other examples of suitable photoinitiators are oxime esters, particularly as named in U.S. Pat. No. 5,019,482, whose description is considered a component of the present description, as well as photoinitiator systems containing ketocoumarinsderivatives, as well as amines as activators, such as is described in detail, e.g., in U.S. Pat. No. 4,366,228, whose description is incorporated by reference in the present description.

As photoinitiators (b), the titanocenes known, for example, from U.S. Pat. No. 4,548,891 are preferably utilized, in particular, titanocenes of formulas (IV) to (VII):

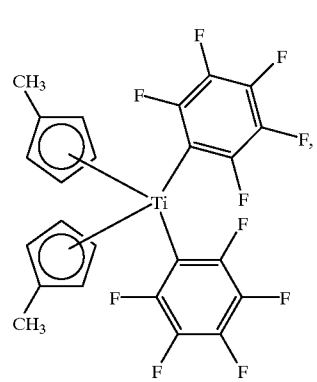

(IV)

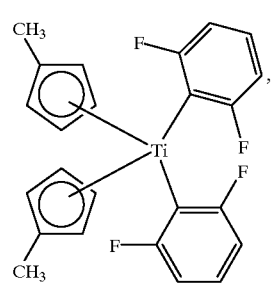

(V)

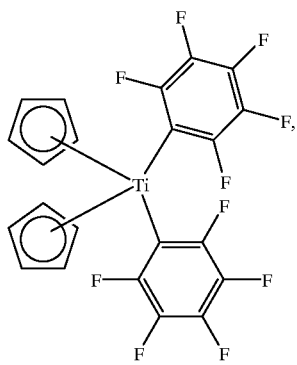

(VI)

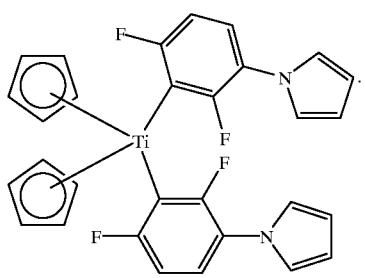

(VII)

Other preferred photoinitiators, which may be utilized in the process according to the invention, are the oxime esters disclosed, for example, in U.S. Pat. No. 5,019,482. With the use of several specific triketone oxime esters, no dark coloring of the mixture occurs, even when heating to high temperatures. These particularly preferred triketoximeesters have the formula (VIII)

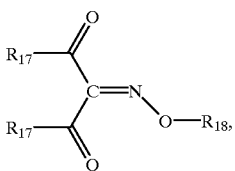

(VIII)

in which the residues $R_{17}$, independently of one another, stand for p-tolyl, p-alkoxyphenyl or mesityl, and $R_{18}$ indicates $C_1$–$C_6$ alkylcarbonyl, $C_1$–$C_6$ alkoxycarbonyl, $C_6$–$C_{14}$ arylcarbonyl or $C_6$–$C_{14}$ aryloxycarbonyl. The triketone oxime esters of formula (VIII) may be prepared according to known methods, e.g., by conversion of the corresponding triketones into oximes (e.g., according to "Organic Synthesis, Vol. 40, Pages 21–23) and subsequent reaction with acid chlorides or chlorocarbonyl acid esters. In the most particularly preferred compounds of formula (VIII), $R_{17}$ stands for p-tolyl and $R_{18}$ stands for $C_6$–$C_{14}$ arylcarbonyl. Particularly preferred is the compound of formula (VIIIa).

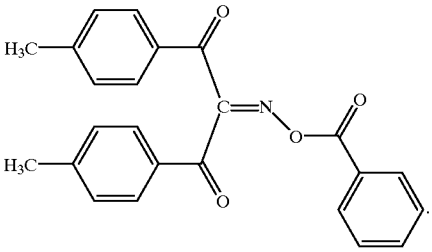

(VIIIa)

Appropriately, the compositions according to the invention contain 0.1 to 20, particularly 1 to 10 wt. % of component (b), with respect to component (a).

The triketoxime esters of formula (VIII) are utilized preferably in combination with an aromatic amine of formula (IX):

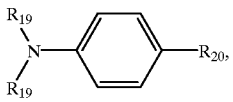

(IX)

in which the two $R_{19}$ residues, independently of one another, stand for $C_1$–$C_3$ alkyl or $C_1$–$C_3$ hydroxyalkyl or form a morpholine group together with the N atom, and $R_{20}$ represents a $C_1$–$C_3$ alkyl group, $C_2$–$C_5$ alkylcarbonyl group, or $C_7$–$C_{10}$ arylcarbonyl group. Suitable aromatic amines of formula (IX) are, for example, 4-dimethyl-aminoacetophenone, 4-morpholinoacetophenone, 4-dimethylaminobenzophenone, 4-morpholinobenz-ophenone, N-phenyldiethanolamine, N-p-tolyldiethylamine and N-p-tolyldiethanolamine. The aromatic amines of formula (IX) are added appropriately in an amount of 0.5–5 wt. %, with respect to component (a).

The named triketoximes and triketoxime/amine mixtures are particularly suitable for exposure with radiation of the mercury i-line. By the additional use of photosensitizers, one can also produce photosensitivity in other spectral regions, e.g., at the wavelength of the g-line (436 nm). For example, one can add a coumarins of formula (X)

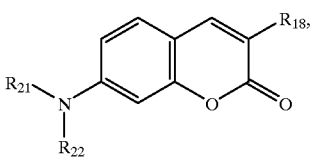

(X)

in which $R_{21}$ and $R_{22}$, independently of one another, are $C_1$–$C_6$ alkyl groups and $R_{18}$ indicates $C_1$–$C_6$-alkylcarbonyl, $C_1$–$C_6$-alkoxycarbonyl, $C_6$–$C_{14}$-arylcarbonyl or $C_6$–$C_{14}$-aryloxycarbonyl.

Preferably, the coumarins disclosed in U.S. Pat. No. 5,019,482, and in particular those introduced there as examples, are utilized. The coumarins of formula (Xa) is particularly preferred

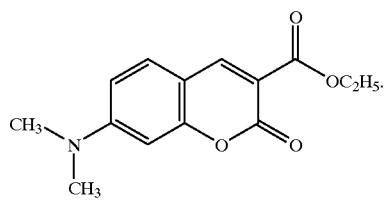
(Xa)

The coumarins of formula (X) are generally utilized in an amount of 0.1–5 wt. % with respect to component (a). Another particularly preferred coumarin has the formula (XI):

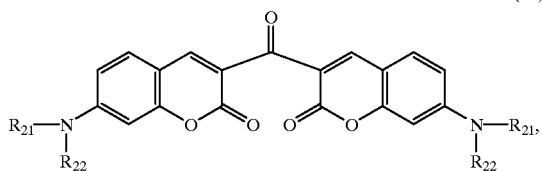
(XI)

in which $R_{21}$ and $R_{22}$ stand for a methyl or an ethyl group. This coumarin derivative is also appropriately utilized in a quantity of 0.1 to 5 wt. %, with respect to component (a).

The photosensitivity of the compositions according to the invention can also be increased by the addition of aromatic heterocyclic compounds, which contain at least one mercapto group. Examples of such compounds are 2-mercaptobenzimidazole, 2-mercaptobenzothiazole, 1-phenyl-5-mercapto- 1H-tetrazole, 2-mercapto-4-phenylthiazole, 2-amino-5-mercapto-4-phenylthiazole, 2-amino-4-mercapto-1,3,4-thiazole, 2-mercaptoimidazole, 2-mercapto-5-methyl-1,3,4-thiazole, 5-mercapto- 1-methyl-1H-tetrazole, 2,4,6-trimercapto-s-triazine, 2-dibutylamino-4,6-dimercapto-s-triazine, 2,5-dimercapto-1,3,4-thiadiazole, 5-mercapto- 1,3,4-thiadiazole, 1-ethyl-5-mercapto- 1,2,3,4-tetrazole, 2-mercapto-6-nitrothiazole, 2-mercaptobenzoxazole, 4-phenyl-2-mercaptothiazole, mercaptopyridine, 2-mercaptoquinoline, 1-methyl-2-mercaptoimidazole and 2-mercapto-(-naphthothiazole. Such mercapto compounds are generally utilized in a quantity of 0.5–5 wt. % relative to component (a). Preferably, 2-mercaptobenzothiazole is used.

Another special form of embodiment of the invention contains a coumarin of formula (XH) as the photoinitiator system:

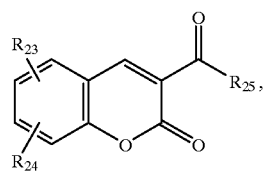
(XII)

in which $R_{23}$ and $R_{24}$, independently of one another, indicate hydrogen or $C_1$–$C_6$ alkoxy and $R_{25}$ stands for $C_6$–$C_{14}$ aryl or a residue of formula (XIII):

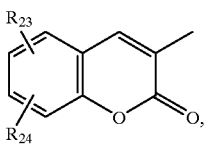
(XIII)

in which $R_{23}$ and $R_{24}$ again have the same meaning as in formula (XII), in mixture with an amino acid of formula (XIV):

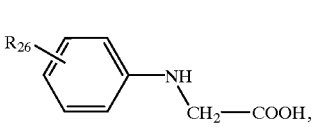
(XIV)

in which $R_{26}$ stands for hydrogen, methyl, ethyl, i-propyl, t-butyl, phenyl, methoxy, ethoxy, hydroxy, hydroxymethyl, dimethylamino, diethylamino, acetyl, propionyl, acetyloxy, propionyloxy, —NHCONH$_2$ or —NHCOOCH$_3$. The coumarins of formula (XII) are known, for example, from U.S. Pat. No. 4,278,751. Coumarins of formula (XII) are preferred, in which one of the residues $R_{23}$ or $R_{24}$ indicates methoxy. Particularly preferred is 3-benzoyl-7-methoxycoumarin. In addition, the amino acids of formula (XIV) are known, and described, for example, in JP-A Hei 03 [1991]- 170, 551 (Chem. Abstr., Vol. 116 (1992), 31468b). Preferably, N-phenylglycine is used. Corresponding compositions of the invention generally contain 0.2–5 wt. % coumarins of formula (XII), 0.5–10 wt. % amino acid of formula (XIV), with respect to component (a).

Other suitable sensitizers, which can be used particularly in combination with coumarins of formula (XII), are the oxazolones described in JP-A Hei [1991] 03-170,552 (Chem. Abstr., Vol. 116 (1992), 48941y), particularly oxazolones of the formula (XV)

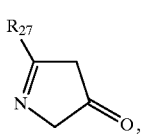
(XV)

in which R27 stands for a group of formulas (XVI) or (XVII)

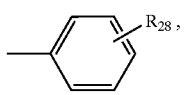
(XVI)

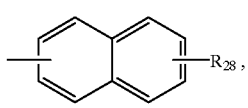
(XVII)

in which $R_{28}$ indicates hydrogen, methyl, ethyl, n-propyl, i-propyl, n-butyl, t-butyl, phenyl, hydroxy, methoxy, ethoxy, n-propoxy, n-butoxy, phenoxy, benzyl, 2-phenylethyl, hydroxymethyl, 2-hydroxyethyl, acetyl, propionyl, acetyloxy, propionyloxy, aminomethyl, 2-aminoethyl, methylamino, dimethylamino, diethylamino, —CONH$_2$, —CONHCH$_3$, —CON(CH$_3$)$_2$, —CONHC$_2$H$_5$ or —CON(C$_2$H$_5$)$_2$. The preferred oxazolone is hereby 3-phenyl-5-isooxazolone.

Compositions of the invention based on the named preferred photoinitiators and initiator systems are suitable particularly for the production of relief structures with radiation of the mercury i-line, due to their high transparency in the i-line region. However, since the compositions also have a high light sensitivity in a broad region from approximately 200 nm to approximately 600 nm, their use is not limited to i-line exposure. Rather actinic radiation of the most varied wavelengths can be used; broadband exposure is possible as well as irradiation with discrete wavelengths (e.g., g-line).

Although generally unnecessary, for further improvement of their solubility in aqueous-alkaline developers, the negatively operating photoresist compositions of the invention may also contain:

(c) at least one other component, which is selected from the group comprised of
(c1) organosilicon compounds with one or more hydroxyl groups,
(c2) compounds of the formula (IIa)

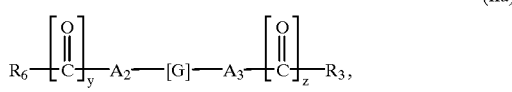

(IIa)

in which
$A_2$ and
$A_3$, independently of one another, stand for an oxygen atom or an $NR_7$ group, in which $R_7$ indicates a hydrogen atom or a $C_1-C_4$ alkyl group, and
[G] stands for a divalent aliphatic or aromatic group, which is unsubstituted or has one or more hydroxyl substituents,
$R_6$ indicates an aryl residue, which has one or more substituents that improve the solubility of the composition in aqueous-alkaline media,
$R_3$ represents a residue with at least one photopolymerizable olefinic double bond, and
y as well as
z independently of one another, indicate the number 0 or 1,
(c3) compounds of formula (IIb)

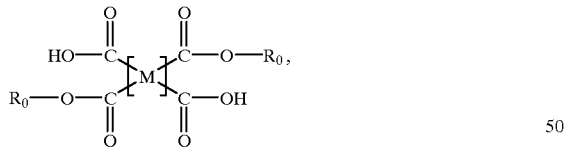

(IIb)

in which
$R_0$ represents the same or different residues with a photopolymerizable olefinic double bond, and
[M] is the residue of the cyclic dianhydride of a tetracarboxylic acid remaining after removal of the anhydride groups, as well as
(c4) mixtures consisting of two or more components selected from components of the type (c1), (c2) and (c3).

The organosilicon compounds (c1) are, e.g., selected from organosilanols and organosiloxanes, each of which has one or two hydroxyl groups, particularly from the group consisting of triphenylsilanol, diphenylsilanediol, 1,4-bis(hydroxydimethylsilyl)benzene and 1,3-bis(4-hydroxybutyl)tetramethyldisiloxane.

The compounds of formula (IIa) contain as residue R6 an aryl residue, preferably with 6 to 14 ring carbons, which has one or more substituents that improve the solubility of the composition in aqueous-alkaline media, particularly an appropriately substituted phenyl residue. In principle, any acid residue can be used for the substituents on the aryl residue, e.g., sulfonic acid residues, HOOC' residues or HO residues. If [G] indicates a divalent aliphatic group in compounds of formula (IIa), then this is appropriately a $C_1-C_{10}$ alkylene group, preferably a $C_2-C_6$ alkylene group, particularly a straight-chain $C_2-C_6$ alkylene group, e.g., an ethylene, trimethylene or tetramethylene group, which is either unsubstituted or has one or more hydroxyl substituents. If [G] indicates a divalent aromatic group for compounds of formula (IIa), then this preferably contains 6 to 20 ring carbons, whereby two or more aromatic rings in the group may be bridged, as the case may be, also via bridge members, e.g., via $C_1-C_4$ alkylene groups, particularly via groups of formula $—CH_2—$ or $>C(CH_3)_2$, or via $>C=O$ or an oxygen atom. The residue $R_3$ in formula (IIa) particularly comprises $C_2-C_6$ alkenyl groups, whereby vinyl and isopropenyl groups are particularly preferred.

Examples of suitable compounds of formula (IIa) are, among others:

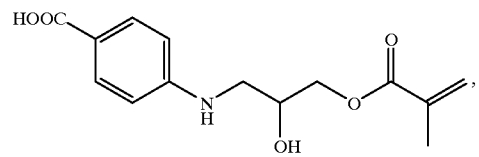

as well as particularly compounds of formula (IIa), in which $A_2$ and $A_3$ both stand for an oxygen atom and in which y and z both indicate the number 1, e.g.:

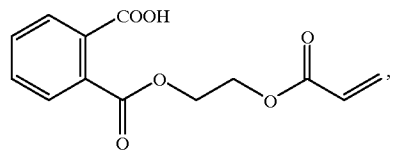

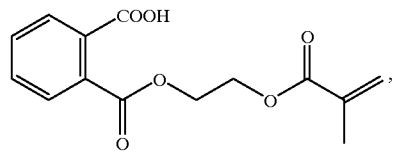

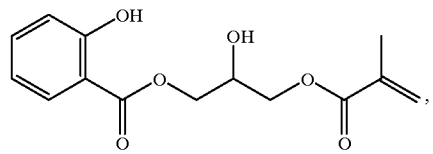

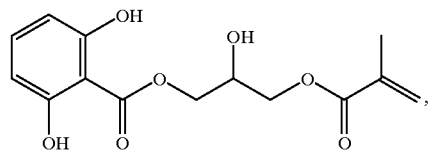

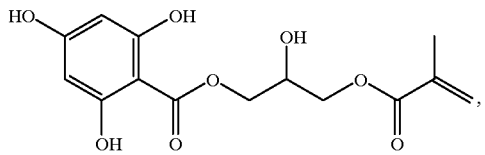

-continued

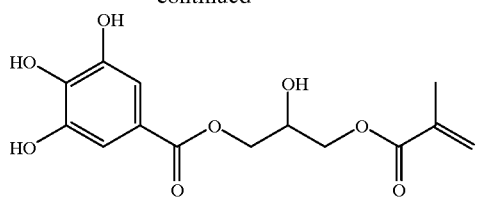

The group [M] may represent, e.g., the residue of one of the dianhydrides remaining after removal of the anhydride groups in the case of compounds of formula (IIb), which were named above in the description of group [X]. The group $R_0$ in formula (IIb) indicates, e.g., vinyl, allyl, methallyl or a residue of formula (III):

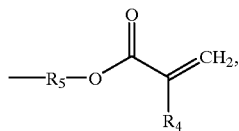
(III)

in which $R_4$ indicates a hydrogen atom or methyl and $R_5$ stands for —$CH_{2n}$— with n=2–12, —$CH_2CH(OH)CH_2$— or polyoxyalkylene with 4–30 C-atoms.

Examples of suitable residues $R_5$ are ethylene, propylene, trimethylene, tetramethylene, 1,2-butanediyl, 1,3-butanediyl, pentamethylene, hexamethylene, octamethylene, dodecamethylene, —$CH_2CH(OH)CH_2$—, —$(CH_2CH_2O)_m$—$CH_2CH_2$—,

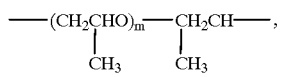

—$(CH_2CH_2CH_2O)_m$—$CH_2CH_2CH_2$— and
—$(CH_2CH_2CH_2CH_2O)_m$—$CH_2CH_2CH_2CH_2$—, whereby m amounts to 1 to 6. $R_5$ is preferably ethylene, propylene, trimethylene or —$CH_2CH(OH)CH_2$—, and R4 is preferably methyl. A residue of formula (III) is particularly preferred, in which R4 indicates methyl and $R_5$ stands for ethylene. A special example of a compound of formula (IIb) is

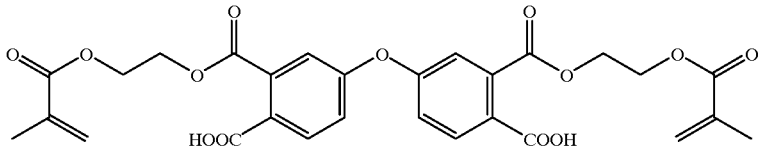

Component (c), if it is present, is preferably selected from the group of substances comprised of:

(c1) triphenylsilanol, diphenylsilanediole, 1,4-bis(hydroxydimethylsilyl)benzene and 1,3-bis(4-hydroxybutyl)tetramethyldisiloxane; as well as (c2) compounds of formula (IIa), in which
[G] stands for a $C_2$–$C_6$ alkylene group, which is either unsubstituted or has one or more hydroxyl substituents, particularly for a group of one of the formulas

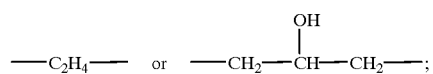

$R_3$ stands for a vinyl group or for an isopropenyl group; and in which

R6 indicates a phenyl residue, which has one, two or three substituents, selected from HO and HOOC substituents.

Component (c2) is particularly selected from compounds of formula (IIa), in which $R_6$ stands for a group selected from the groups of formulas:

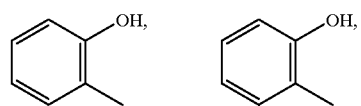

 

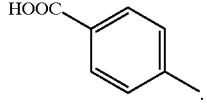

In addition, as component (c2), compounds of formula (IIa) are preferred, in which $A_2$ and
$A_3$ both stand for an oxygen atom and in which
y and
z both indicate the number 1.

Component (c) can be contained in the photoresist compositions according to the invention, e.g., in a quantity of 10 to 40 wt. %, relative to the total weight of components (a)+(c) in the composition. A mixture of type (c4), which is comprised of at least one component of type (c1) as well as at least one component of type (c2), whereby the weight ratio of (c1) to (c2) preferably amounts to approximately 1 to 1, is well suitable as component (c1). Component (c1) is hereby preferably a silanediol, such as diphenylsilanediol.

Another special form of embodiment of the negatively operating photo-resist according to the invention contains
(d) a component, selected from
acrylic acid esters as well as methacrylic acid esters of aromatic as well as aliphatic polyols;
allyl ethers of aromatic as well as aliphatic polyols; and
allyl esters of aromatic as well as aliphatic polycarboxylic acids.

Component (d) can be present alone as well as in combination with component (c).

As component (d) are considered, for example, ethers, and particularly esters and partial esters of acrylic acid or methacrylic acid and aromatic and particularly aliphatic polyols with particularly 2–30 C-atoms or cycloaliphatic polyols with preferably 5 or 6 ring carbons. These polyols may also be modified with epoxides, such as ethylene oxide or propylene oxide. Further, esters and partial esters of polyoxyalkylene glycols are also suitable. Examples of suitable components (d) are: ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, polyethylene glycol di(meth)acrylates with a mean molecular weight in the range of 200–2000. Trimethylolpropane ethoxylate tri(meth)acrylate, trimethylolpropane polyethoxylate tri (meth)acrylates with a mean molecular weight in the range of 500–1500, pentaerythritol tri(meth)acrylate, pentaerythritol di(meth)acrylate, pentaerythritol tetra(meth)acrylate, dipentaerythritol di(meth)acrylate, dipentaerythritol tri (meth)acrylate, dipentaerythritol tetra(meth)acrylate, dipentaerythritol hexa(meth)acrylate, tripentaerythritol octa (meth)acrylate, 1,3-butanediol di(meth)acrylate, sorbitol tri (meth)acrylate, sorbitol tetra(meth)acrylate, sorbitol penta (meth)acrylate, sorbitol hexa(meth)acrylate, oligoester (meth)acrylates, glycerin di(meth)acrylate, glycerin tri (meth)acrylate, 1,4-cyclohexane di(meth)acrylate, bis(meth) acrylates of polyethylene glycols with a mean molecular weight in the range of 500–1500, ethylene glycol diallyl ether, trimethylpropane triallyl ether, pentaerythritol triallyl ether, succinic acid and adipic acid diallyl ethers or mixtures of the named compounds.

Preferred compositions according to the invention contain photoinitiator (b) in a quantity of 0.1 to 20 wt. %, particularly from 0.5 to 10 wt. %, component (c), if present, in a quantity of 25 to 45 wt. %, and component (d), if present, in a quantity of 3 to 50 wt. %, particularly from 5 to 25 wt. %, each time with respect to the total weight of components (a), (b), (c) and (d). The balance up to 100 wt. % is hereby formed of component (a), which is contained preferably in a quantity of 20 to 95 wt. %, particularly from 40 to 70 wt. %, and very particularly from 50 to 65 wt. %, relative to the total weight of components (a), (b), (c) and (d) in the named compositions.

The compositions according to the invention may also contain other additives, e.g., stabilizers, particularly inhibitors of thermal polymerization, such as thiodiphenylamine and alkylphenols, e.g., 4-tert-butylphenol, 2,5-di-tert-butylhydro8quinone or 2,6-di-tert-butyl-4-methylphenol. Other suitable initiators and sensitizers are, e.g., aromatic ketones such as tetramethyldiaminobenzophenone, benzophenone, Michler's ketone and other aromatic ketones, e.g., the compounds mentioned in U.S. Pat. No. 3,552,973, benzoin, benzoin ethers, such as, e.g., benzoin methyl ether, methyl benzoin, ethyl benzoin, p-maleinimidobenzenesulfonic acid azide, thioxanthone derivatives, such as thioxanthone, 2-chlorothioxanthone or 2-isopropylthioxanthone or bis azides, such as, e.g., 2,6-(4'-azidobenzylidene-4)-methylcyclohexan-1-one. Other additives are solvents, which can be used alone or in combinations, such as, e.g., N-methylpyrrolidone, (-butyrolactone, ethylene glycol monomethyl ether, cyclopentanone, dimethylformamide, dimethylacetamide, and hexamethylphosphoric acid triamide; pigments, colorants, fillers, adhesives, wetting agents and softeners, as well as dyes that can influence the spectral sensitivity of the mixtures by their intrinsic absorption.

The photosensitive compositions are produced by mixing the components in the usual equipment for this purpose.

The photosensitive compositions are excellently suitable as coating agents for substrates of all types, e.g., ceramics, metals such as copper or aluminum, semimetals and semiconductor materials, such as silicon, germanium, GaAs, $SiO_2$ and $Si_3N_4$ layers, in which a structured protective layer or a photographic image can be introduced by photopolymerization and subsequent treatment of the coating with a developer.

As already mentioned above, the negative photoresists according to the invention have the great advantage when compared with conventional negative resists based on polyimide precursors of formula (1), the fact that they can be developed with pure aqueous-alkaline developers. "Developable" indicates that a 10-$\mu$m thick layer of the resist can be completely removed from the substrate preferably within at most five minutes with a developer. Preferred aqueous-alkaline media are thereby conventional aqueous-alkaline developers, such as are common, e.g., for the development of conventional positive photoresists based on 1,2-diazonaphthoquinones and phenolic binders, such as novolaks. Such developers are well known to the person skilled in the art and contain as alkaline compounds, e.g., sodium or potassium hydroxide, the corresponding carbonates, bicarbonates, silicates, metasilicates, but preferably metal-free bases, such as ammonia or amines, e.g., ethylamine, n-propylamine, diethylamine, di-n-propylamine, triethylamine, methyldiethylamine, alkanolamines, e.g., dimethylethanolamine, triethanolamine, quaternary ammonium hydroxides, e.g. tetramethylammonium hydroxide (TMAH) or tetraethylammonium hydroxide. Suitable aqueous-alkaline developer solutions are generally up to 0.5 normal relative to alkali, but may also be diluted suitably prior to use. For example, aqueous alkaline solutions of a normality of approximately 0.15 to 0.4, preferably from 0.20 to 0.35, are well applicable.

The invention also concerns a process for the production of relief images, comprising the following steps:

(A) Coating a substrate with a negative photoresist composition, as described above;

(B) Image-area exposure of the coated substrate;

(C) Removal of the unexposed places by means of an aqueous-alkaline developer, which is free of organic solvents.

The coated substrates can be produced, for example, by preparing a solution or suspension of the composition. The selection of the solvent and the concentration are primarily directed according to the type of composition and according to the coating process. The solution is uniformly introduced onto a substrate by means of known coating processes, e.g., by spinning, immersing, doctor-blade coating, suspended casting, painting, spraying, especially by electrostatic spraying and reverse-roll coating. It is also possible to introduce the light-sensitive layer onto a temporary, flexible carrier and then to coat the final substrate, e.g., a copper-covered printed circuit board by layer transfer via lamination.

The quantity applied (layer thickness) and the type of substrate (layer carrier) are dependent on the desired field of application. It is particularly advantageous that the photosensitive compositions can be used in very variable layer thicknesses. This range of layer thickness comprises values from approximately 0.5 $\mu$m to more than 100 $\mu$m.

The photopolymerization of (meth)acrylates and similar olefinic unsaturated compounds is prevented, as is known, by the oxygen in air, particularly in thin layers. This effect can be mitigated with the known conventional methods, such as, e.g., introducing a temporary covering layer of polyvinyl alcohol or by preexposing or preconditioning under inert gas.

After the coating, the solvent is removed as a rule by drying, and a layer of photosensitive composition on the carrier results. Exposure of the material with radiation to produce the image is undertaken in the usual way. The wavelength of the radiation to be used is hereby dependent on the special composition in the usual way, particularly on the photoinitiators used and the sensitizers utilized, if any. The wavelength of suitable radiation generally lies between 200 and 600 nm, preferably between 300 and 450 nm.

After exposure, the unexposed places of the photoresist are removed in the usual way by treatment with a developer, is described in more detail above.

After development, (D) a curing of the exposed and developed material is preferably produced. Curing is undertaken preferably at temperatures between 300° C. and 400° C., whereby the polyimide precursors are converted into heat-stable polyimides and volatile fractions are removed, so that at high temperatures, stable relief structures are obtained.

The process according to the invention is characterized by a high sensitivity during exposure and supplies relief structures that are resistant to heat and chemicals with greater edge sharpness. For example, structures with minimal dimensions of 8 to 10 µm can be resolved with the method, without anything further, if the coating thickness amounts to 10 µm.

Possible fields of application of the process of the invention include the use as photoresists for electronics (galvanic [electrolytic] resists, etching resists, solder top resist), the production of printing plates, such as offset printing plates or screen printing plates, application in etching of molded parts, and particularly the production of polyimide protective lacquers and dielectric layers in electronics, particularly in microelectronics.

The invention thus also concerns a process for the production of an electronic component, whereby this process comprises a process for the production of relief images, as described above.

EXAMPLE 1.1

Production of a polyimide precursor from pyromellitic acid dianhydride (PMDA), 4,4'-oxydianiline (ODA) and 3-hydroxybenzyl alcohol (3-HBA).

14.06 g (64.5 mmoles) of pyromellitic acid dianhydride (dried for 12 hours at 140° C.) and 16.33 g (131.58 mmoles) of 3-hydroxybenzyl alcohol are suspended in 50 ml of N-methylpyrrolidone (NMP), which is dried over a molecular sieve. The suspension is heated to 100° C. for three hours, whereby after a few minutes, a clear solution is obtained. The reaction mixture is cooled to room temperature and 21.43 g (270.9 mmoles) of pyridine and 90 ml of N-methylpyrrolidone are added. Subsequently, the reaction mixture is cooled to a temperature of minus 10° C. and 16.12 g (135.5 mmoles) of $SOCl_2$ are added in the course of 10 minutes, while the temperature is maintained at minus 10±4° C. During the addition of $SOCl_2$, the viscosity increases. After diluting with 50 ml of N-methylpyrrolidone, the mixture is stirred for 2 hours at room temperature. Then 11.08 g (58.7 mmoles) of oxydianiline (ODA), dissolved in 100 ml of N-methylpyrrolidone, are added to the reaction mixture dropwise for twenty minutes at a temperature of 20 to 23° C.; the mixture is then left to stir overnight at room temperature. Finally, the polyimide precursor is precipitated in 5 liters of water and the water-polymer mixture is stirred for 15 minutes at a velocity of 5000 rpm. The polymer is filtered off, stirred again for 30 minutes in 4 liters of water and again filtered off. Finally the thus-obtained polyimide precursor is dried for three days at 45° C. in vacuum.

EXAMPLE 1.2

A negatively operating photoresist composition, produced by mixing of:

| 16.58 wt. % | (a) | A photoreactive polyimide precursor with Mw approximately 13,000, produced from pyromellitic acid dianhydride, 4,4'-oxydianiline and methacrylic acid 2-hydroxyethyl ester |
| --- | --- | --- |
| 16.58 wt. % | (a) | Polyimide precursor from Example 1.1 |
| 1.16 wt. % | (b) | Titanocene according to formula (VII) |
| 8.29 wt. % | (c1) | Diphenylsilanediol |
| 8.29 wt. % | (c2) | 3-(o-Hydroxybenzoyloxy)-2-(hydroxy)propyl methacryate |
| 4.97 wt. % | (d) | Tetraethylene glycol dimethacrylate |
| 0.07 wt. % | | 1,4-Benzoquinone |
| 0.10 wt. % | | 3,3'-Carbonylbis(7-diethylaminocumarin) |
| 43.96 wt. % | | N-Methylpyrrolidone | is poured into a vessel, which is rotated overnight, whereby a clear resin solution forms, which is then subjected to a pressure filtration through a filter of pore width 0.8 µm. The resin solution is spun onto a silicon wafer pretreated with a bonding agent (3500 rpm, 30 seconds) and the coated wafers are then dried for 5 minutes at 100° C. on a hot plate. Subsequently, a 10 µm thick uniform polymer layer is obtained on the silicon wafer.

The wafer is then exposed with an exposure device of the type Karl-Süss MA 150 in vacuum contact, whereby a chromium mask is used. Exposure is conducted with a mercury ultra-high-pressure lamp, and the radiation power is measured with an OAI power meter and the 405-nm probe. After exposure, the image is developed with an aqueous 0.262 normal solution of tetramethylammonium hydroxide (TMAH) for 75 seconds and then rinsed with water. For the described process, an exposure energy of 250 $mJ/cm^2$ is necessary in order to produce good structures. Highly resolved relief structures with good edge sharpness are obtained, whereby 20 µm wide lines are still resolved.

EXAMPLE 2.1

Production of a polyimide precursor of pyromellitic acid dianhydride (PMDA), 4,4'-oxydianiline (ODA) and 2-hydroxybenzyl alcohol (2-HBA).

14.06 g (64.5 mmoles) of pyromellitic acid dianhydride (dried for 12 hours at 140° C.) and 16.33 g (131.58 mmoles) of 2-hydroxybenzyl alcohol are suspended in 50 ml of N-methylpyrrolidone (NMP), which is dried over a molecular sieve. The suspension is heated to 100° C. for three hours, whereby a clear solution is obtained after several minutes. Then 11.75 g (58.7 mmoles) of 4,4'-oxydianiline (ODA), dissolved in 25 g of N-methylpyrrolidone, are slowly added at room temperature. The reaction mixture is cooled to a temperature of 5 to 10° C. and 26.62 g (129 mmoles) of N,N'-dicyclohexyl carbodiimide (DCC), dissolved in 75 g of N-methylpyrrolidone, are added dropwise to the reaction mixture for thirty minutes at a temperature of 5 to 10° C. The obtained mixture is then first stirred for one hour at this temperature and then stirred overnight at room temperature. The reaction mixture is then filtered and the filter cake is washed with N-methylpyrrolidone. The precipitation of the polyimide precursor and its further workup are conducted as in Example 1.

EXAMPLE 2.2

A negatively operating photoresist composition, produced from

| | | |
|---|---|---|
| 16.58 wt. % | (a) | Photoreactive polyimide precursor with Mw approximately 13,000, produced from pyromellitic acid dianhydride, 4,4'-oxydianiline and methacrylic acid-2-hydroxyethyl ester |
| 16.58 wt. % | (a) | Polyimide precursor from Example 2.1 |
| 1.16 wt. % | (b) | Titanocene according to formula (VII) |
| 8.29 wt. % | (c1) | Diphenylsilanediol |
| 8.29 wt. % | (c2) | 3-(o-Hydroxybenzoyloxy)-2-(hydroxy)propyl methacrylate) |
| 4.97 wt. % | (d) | Tetraethylene glycol dimethacrylate |
| 0.07 wt. % | | 1,4-Benzoquinone |
| 0.10 wt. % | | 3,3'-Carbonylbis(7-diethylaminocumarin) |
| 43.96 wt. % | | N-Methylpyrrolidone | is processed as in Example 1.2, with the exception that the image is developed with a 0.331 N solution of tetramethylammonium hydroxide (TMAH) in water. In the described process, an exposure energy of 250 mJ/cm² is necessary in order to produce good structures. Highly resolved relief structures with good edge sharpness are also obtained here, whereby 20 µm wide lines are still resolved.

Example 3.1: Production of a polyimide precursor of pyromellitic acid dianhydride, 4,4'-oxydianiline, 3-hydroxybenzyl alcohol and 2-hydroxyethyl methacrylate (HEMA).

14.06 g (64.5 mmoles) of pyromellitic acid dianhydride (dried for 12 hours at 140° C.), 18.6 g (129 mmoles) of 2-hydroxyethyl methacrylate, 0.05 g of hydroquinone and 10.7 g of pyridine are mixed with 140 g of diglyme and stirred for 18 hours at a temperature of 60° C., in order to produce a diester of pyromellitic acid and 2-hydroxyethyl methacrylate. A diester of pyromellitic acid and 3-hydroxybenzyl alcohol is produced as described in Example 1.1. An equimolar mixture of both diesters is chlorinated by means of SOCl₂ and converted with 4,4'-oxydianiline into the finished polyimide precursor also according to the instructions in Example 1.1.

EXAMPLE 3.2

A negatively operating photoresist composition, produced by mixing of

| | | |
|---|---|---|
| 33.16 wt. % | (a) | Polyimide precursor from Example 3.1 |
| 1.16 wt. % | (a) | Titanocene according to formula (VII) |
| 8.29 wt. % | (c1) | Diphenylsilanediol |
| 8.29 wt. % | (c2) | 3-(o-Hydroxybenzoyloxy)-2-(hydroxy)propyl methacrylate |
| 4.97 wt. % | (d) | Tetraethylene glycol dimethacrylate |
| 0.07 wt. % | | 1,4-Benzoquinone |
| 0.10 wt. % | | 3,3'-Carbonylbis(7-diethylaminocumarin) |
| 43.96 wt. % | | NMP | is processed as in Example 2.2. In the case of the described process, an exposure energy of 500 mJ/cm² is necessary in order to produce good structures. Highly resolved relief structures with good edge sharpness are obtained, whereby 20µm wide lines are still resolved.

EXAMPLE 4

Example 3 is repeated, but whereby 2-hydroxybenzyl alcohol is used instead of 3-hydroxybenzyl alcohol and the negative resist is developed with a 0.331 N solution of tetramethylammonium hydroxide (TMAH) in water within 25 seconds. In the process described, an exposure energy of 250 mJ/cm² is necessary in order to produce good structures. Highly resolved relief structures with good edge sharpness are obtained, whereby 20-µm wide lines are still resolved.

EXAMPLE 5.1

Example 3.1 is repeated, with the exception that the polyimide precursor is used that is produced from the diester of pyromellitic acid and 2-hydroxyethyl methacrylate and a diester of pyromellitic acid and 2-hydroxybenzyl alcohol in the molar ratio of 1:2.

EXAMPLE 5.2

A negatively operating photoresist composition, produced by mixing of:

| | | |
|---|---|---|
| 39.75 wt. % | (a) | Polyimide precursor from Example 5.1 |
| 1.39 wt. % | (b) | Titanocene according to formula (VII) |
| 5.97 wt. % | (d) | Tetraethylene glycol dimethacrylate |
| 0.08 wt. % | | 1,4-Benzoquinone |
| 0.12 wt. % | | 3,3'-Carbonylbis (7-diethylaminocumarin) |
| 52.69 wt. % | | NMP | is processed as in Example 2.2, whereby, however, the development of the negative resist is produced with an aqueous 0.331 N solution of tetramethylammonium hydroxide (TMAH) within 25 seconds. In the described process, an exposure energy of 250 mJ/cm² is necessary in order to produce good structures. Highly resolved relief structures with good edge sharpness are obtained, whereby 20-µm wide lines are still resolved.

What is claimed is:

1. A negatively operating photoresist composition containing
   (a) a polyimide precursor containing repeating structural units of formula (I)

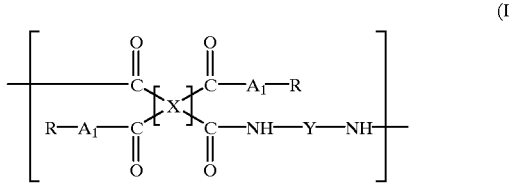

in which
   $A_1$ stands for an oxygen atom or an NH group;
   R stands for the same or different organic residues, at least one part of which can be photopolymerized;
   [X] indicates the residue of a cyclic dianhydride of the same or different tetracarboxylic acids remaining after removal of the anhydride groups; and
   Y indicates the residue of the same or different diamines remaining after removal of the amino groups, and
   (b) a photoinitiator for polymerizing olefimic double bonds, characterized in that
   R stands for organic residues, selected from
      $R_1$ organic residues with a photopolymerizable olefinic double bond, and
      $R_2$ aryl residues, each of which have one or more substituents that improve the solubility of the photoresist composition in aqueous-alkaline media, and the composition includes overall as many structural units of formula (I), which have residues $R_2$, so that the composition can be developed by means of aqueous-alkaline developers for photoresists, which are free of organic solvents.

2. The negatively operating photoresist composition according to claim 1, which contains as component (a) a composition of polyimide precursors, comprised of (a1) at least one polyimide precursor, which contains repeating structural units of formula (I), in which R represents an organic residue $R_1$ with a photopolymerizable olefinic double bond, and (a2) at least one other polyimide precursor, which contains repeating structural units of formula (I), in which R represents an aryl residue $R_2$ which has one or more substituents that improve the solubility of the photoresist composition in aqueous-alkaline media.

3. The negatively operating photoresist composition according to claim 1, wherein the molar ratio between groups $R_1$ and groups $R_2$ in the composition amounts to 4:1 to 1:4.

4. The negatively operating photoresist composition according to claim 1, wherein $R_2$ is selected from the group consisting of: aryl and aralkyl residues, each of which has one to three HO substituents bound to the arylcarbon atoms.

5. The negatively operating photoresist composition according to claim 4, wherein $R_2$ is selected from the group consisting of: 2-hydroxybenzyl, 3-hydroxybenzyl and 4-hydroxybenzyl.

6. The negatively operating photoresist composition according to claim 1, which contains (c) at least one other component, which is selected from the group comprised of
 (c1) organosilicon compounds with one or more hydroxyl groups,
 (c2) compounds of formula (IIa)

$$R_6 {-\!\!\left[\!\!-\overset{O}{\overset{\|}{C}}-\!\!\right]_{\!\!y}\!\!-A_2-[G]-A_3-\!\!\left[\!\!-\overset{O}{\overset{\|}{C}}-\!\!\right]_{\!\!z}\!\!-} R_3,$$ (IIa)

in which $A_2$ and $A_3$, independently of one another, stand for an oxygen atom or an $NR_7$ group, in which $R_7$ indicates a hydrogen atom or a $C_1$–$C_4$ alkyl group, and

[G] stands for a divalent aliphatic or aromatic group, which is unsubstituted or has one or more hydroxyl substituents, R6 indicates an aryl residue, which has one or more substituents that improve the solubility of the composition in aqueous-alkaline media, $R_3$ represents a residue with at least one photopolymerizable olefinic double bond, and y as well as z, independently of one another, indicate the number 0 or 1, (c3) compounds of formula (IIb)

$$\text{HO}-\overset{O}{\overset{\|}{C}}\!\!-\!\![M]\!\!-\!\!\overset{O}{\overset{\|}{C}}-O-R_0,$$
$$R_0-O-\overset{O}{\overset{\|}{C}}\!\!-\!\![M]\!\!-\!\!\overset{O}{\overset{\|}{C}}-OH$$ (IIb)

in which $R_0$ represents the same or different residues with a photopolymerizable olefinic double bond, and

[M] is the residue of a cyclic dianhydride of a tetracarboxyclic acid remaining after the removal of the anhydride groups, as well as (c4) mixtures comprised of two or more components selected from components (c1), (c2) and (c3).

7. The negatively operating photoresist composition according to claim 6, in which component (c) is selected from the group consisting of:

(c1) triphenylsilanol, diphenylsilanediol, 1,4-bis(hydroxydimethylsilyl)benzene and 1,3-bis(4-hydroxybutyl)tetramethyl disiloxane; and (c2) compounds of formula (IIa), in which

[G] stands for a $C_2$–$C_6$ alkylene group, which is either unsubstituted or has one or more hydroxyl substituents, particularly for a group of one of the formulas:

$$-\!\!-C_2H_4-\!\!- \quad \text{or} \quad -\!\!-CH_2-\overset{\overset{\text{OH}}{|}}{CH}-CH_2-\!\!-$$

$R_3$ stands for a vinyl or for an isopropenyl group; and in which $R_6$ indicates a phenyl residue, which has one, two or three substituents, selected from HO and HOOC substituents.

8. The negatively operating photoresist composition according to claim 6, wherein the component (c2) is selected from compounds of formula (IIa), in which $R_6$ stands for a group selected from groups of the formulas:

[structures showing hydroxyl- and carboxyl-substituted phenyl groups]

and

9. The negatively operating photoresist composition according to claim 6, wherein component (c2) is selected from compounds of formula (IIa), in which $A_2$ and $A_3$ both stand for an oxygen atom and in which y and z both indicate the number 1.

10. The negatively operating photoresist composition according to claim 6, wherein component (c) is present in a quantity of 10 to 40 wt. %, with respect to the total weight of components (a)+(c) in the composition.

11. The negatively operating photoresist composition according to claim 10, which contains as component (c) a mixture (c4), which comprises at least one component (c1) as well as at least one component (c2), whereby the weight ratio of (c1) to (c2) amounts to approximately 2 to 1 up to approximately 1 to 2.

12. The negatively operating photoresist composition according to claim 1, further comprising:
    (d) a component selected from the group consisting of:
        acrylic acid esters as well as methacrylic acid esters of aromatic as well as aliphatic polyols;
        allyl ethers of aromatic as well as aliphatic polyols; and
        allyl esters of aromatic as well as aliphatic polycarboxylic acids.

13. Process for the production of relief images, which comprises the following steps:

(A) Coating a substrate with a negatively operating photoresist composition according to claim 1;
    (B) Image-area exposure of the coated substrate; and
    (C) Removal of the unexposed sites by means of an aqueous-alkaline developer, which is free of organic solvents.

14. Process according to claim 13, further comprising another process step:
    (D) The curing of the exposed and developed material.

15. Process for the production of an electronic component, which includes a process for the production of relief images according to claim 13.

* * * * *